US010892698B2

(12) United States Patent
Aoki et al.

(10) Patent No.: US 10,892,698 B2
(45) Date of Patent: Jan. 12, 2021

(54) CURRENT DETECTION APPARATUS AND CONTROL APPARATUS OF ROTARY ELECTRIC MACHINE

(71) Applicant: DENSO CORPORATION, Kariya (JP)

(72) Inventors: Yasuaki Aoki, Kariya (JP); Yosuke Matsuki, Kariya (JP); Hideji Yoshida, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/394,165

(22) Filed: Dec. 29, 2016

(65) Prior Publication Data
US 2017/0201201 A1 Jul. 13, 2017

(30) Foreign Application Priority Data

Jan. 7, 2016 (JP) .................................. 2016-001805

(51) Int. Cl.
*H02P 21/22* (2016.01)
*G01R 1/20* (2006.01)
(Continued)

(52) U.S. Cl.
CPC .............. *H02P 21/22* (2016.02); *G01R 1/203* (2013.01); *G01R 19/0092* (2013.01); *H02P 6/16* (2013.01); *H02P 27/08* (2013.01)

(58) Field of Classification Search
CPC .. H20P 21/22; H02P 21/22; H02P 6/16; H02P 27/08; H02P 21/34; H02P 21/14;
(Continued)

(56) References Cited

U.S. PATENT DOCUMENTS 5,396,247 A * 3/1995 Watanabe ............. G04F 10/005
341/157
7,161,323 B2 * 1/2007 Ajima .................... B62D 5/046
318/560
(Continued)

FOREIGN PATENT DOCUMENTS

JP 2003-111479 A 4/2003
JP 2003-164159 A 6/2003
(Continued)

OTHER PUBLICATIONS

Ichikawa, Shinji et al., "Sensorless of Salient-Pole Permanent Magnet Synchronous Motors Using Extended Electromotive Force Models," pp. 1088-1096, 2002, vol. 122-D, No. 12, Japan.

Primary Examiner — Eduardo Colon Santana
Assistant Examiner — Devon A Joseph
(74) Attorney, Agent, or Firm — Oliff PLC

(57) ABSTRACT

In a current detection apparatus, an arm current detection unit detects each of at least first and second phase currents having respective amplitudes and flowing in a multiphase rotary electric machine based on a potential difference between input and output terminals of the corresponding one of first and second detection switches during the corresponding one of the first and second detection switches being on. A bus current detection unit detects each of at least bus-based first and second phase currents corresponding to the first and second phases of the multiphase rotary electric machine based on a current flowing through one of first and second buses. An amplitude correction unit corrects the first and second phase currents based on the bus-based first and second phase currents such that the amplitudes of the respective first and second phase currents match with each other.

12 Claims, 11 Drawing Sheets

(51) Int. Cl.
*G01R 19/00* (2006.01)
*H02P 6/16* (2016.01)
*H02P 27/08* (2006.01)

(58) Field of Classification Search
CPC .. H02P 2205/01; H02P 2207/05; H02P 29/60; G01R 1/203; G01R 19/0092
USPC ...................................................... 318/400.7
See application file for complete search history.

(56) References Cited

U.S. PATENT DOCUMENTS

| | | | | |
|---|---|---|---|---|
| 8,890,450 B2* | 11/2014 | Maekawa | ............... | H02P 21/26 318/400.02 |
| 9,059,657 B2* | 6/2015 | Maekawa | ............. | H02P 27/085 |
| 9,362,860 B2* | 6/2016 | Sugawara | ............... | H02P 21/22 |
| 9,647,604 B2* | 5/2017 | Arisawa | .................. | H02M 1/32 |
| 10,097,115 B2* | 10/2018 | Qian | ....................... | H02P 6/182 |
| 2003/0098668 A1* | 5/2003 | Jadric | .................... | H02M 5/458 318/801 |
| 2004/0169488 A1* | 9/2004 | Maeda | ....................... | H02P 6/28 318/801 |
| 2007/0296371 A1* | 12/2007 | Aoki | ....................... | H02P 6/182 318/700 |
| 2008/0265829 A1* | 10/2008 | Hayashi | .................. | H02P 21/26 318/781 |
| 2009/0058334 A1 | 3/2009 | Yamamoto | | |
| 2009/0134822 A1* | 5/2009 | Hamasaki | ............... | H02P 27/08 318/400.04 |
| 2009/0134826 A1* | 5/2009 | Hamasaki | ............... | H02P 6/14 318/400.32 |
| 2009/0146590 A1* | 6/2009 | Hamasaki | ............... | H02P 27/08 318/400.02 |
| 2009/0189555 A1* | 7/2009 | Chen | ...................... | H02P 21/22 318/400.07 |
| 2009/0263260 A1* | 10/2009 | Goto | ................... | H02M 3/3376 417/410.1 |
| 2010/0029195 A1* | 2/2010 | Jalali | ..................... | F24F 3/0442 454/341 |
| 2010/0194319 A1* | 8/2010 | Ito | .......................... | H02P 21/14 318/400.13 |
| 2012/0074888 A1* | 3/2012 | Maekawa | ................. | H02P 6/18 318/400.36 |
| 2013/0158808 A1* | 6/2013 | Imamura | ................. | H02P 27/08 701/42 |
| 2013/0234446 A1* | 9/2013 | Kishibata | ............... | F02N 11/08 290/38 R |
| 2014/0035491 A1* | 2/2014 | Mukai | ................... | B62D 5/046 318/400.02 |
| 2014/0176027 A1* | 6/2014 | Osaki | ....................... | H02P 6/28 318/400.2 |
| 2014/0225537 A1* | 8/2014 | Omata | .................... | H02P 21/26 318/400.02 |
| 2015/0061555 A1* | 3/2015 | Hamasaki | ................. | H02P 6/16 318/400.06 |
| 2015/0124502 A1* | 5/2015 | Watanabe | ........... | H03K 17/166 363/97 |
| 2015/0171070 A1 | 6/2015 | Hanaoka | | |
| 2016/0049896 A1* | 2/2016 | Arisawa | ........... | H02M 7/53871 318/504 |

FOREIGN PATENT DOCUMENTS

| | | |
|---|---|---|
| JP | 2004-064860 A | 2/2004 |
| JP | 2004-064903 A | 2/2004 |
| JP | 2006-254671 A | 9/2006 |
| JP | 2010-022162 A | 1/2010 |
| JP | 2011-087413 A | 4/2011 |
| JP | 2011-125130 A | 6/2011 |

* cited by examiner

FIG.2

| VOLTAGE VECTOR | SWITCH BEING ON | | | 1 SHUNT (IDC) | ARM |
|---|---|---|---|---|---|
| V0 | Sun | Svn | Swn | NON-DETECTION | $-Iu, -Iv, -Iw$ |
| V1 | Sup | Svn | Swn | $Iu$ | $-Iv, -Iw$ |
| V2 | Sup | Svp | Swn | $-Iw$ | $-Iw$ |
| V3 | Sun | Svp | Swn | $Iv$ | $-Iu, -Iw$ |
| V4 | Sun | Svp | Swp | $-Iu$ | $-Iu$ |
| V5 | Sun | Svn | Swp | $Iw$ | $-Iu, -Iv$ |
| V6 | Sup | Svn | Swp | $-Iv$ | $-Iv$ |
| V7 | Sup | Svp | Swp | NON-DETECTION | NON-DETECTION |

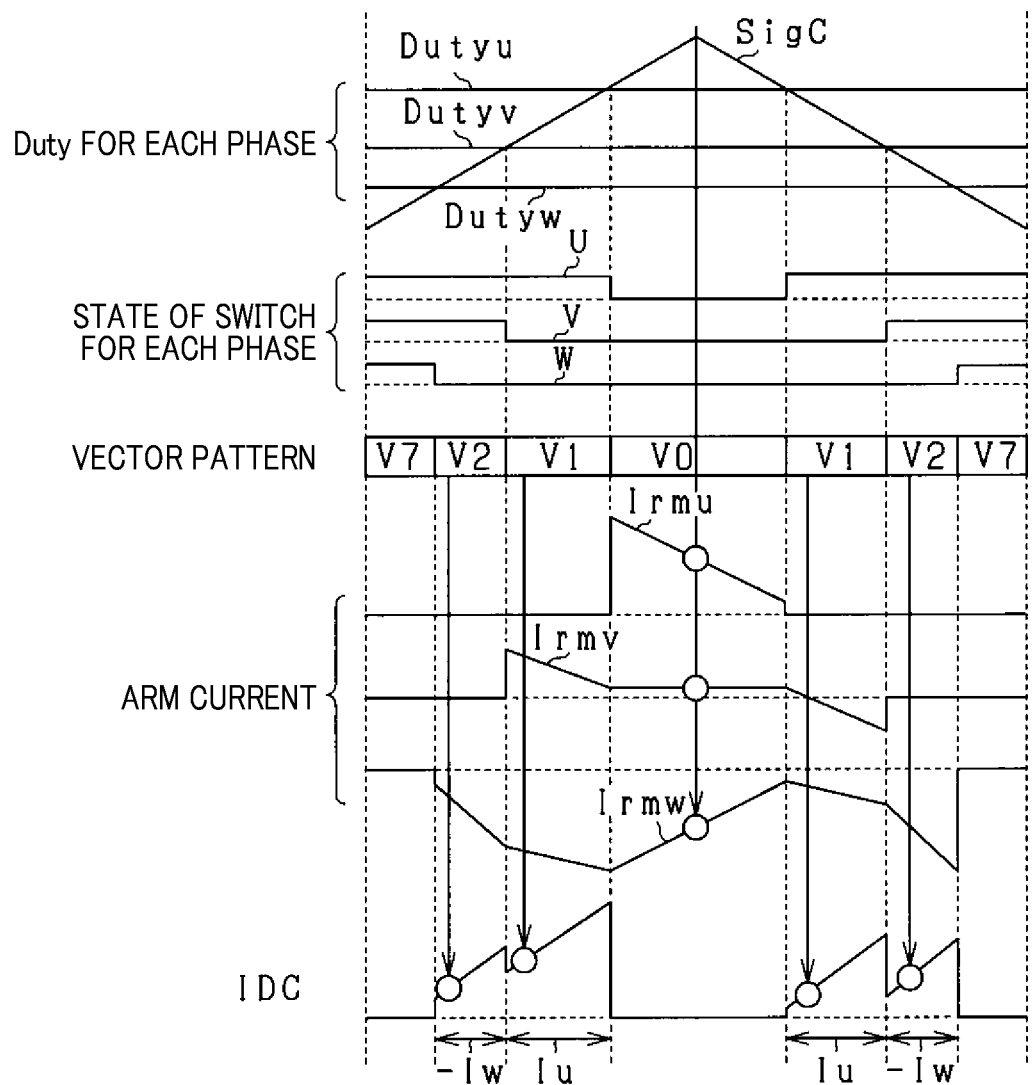

| VOLTAGE VECTOR | SWITCH BEING ON | | | 1 SHUNT (IDC) | ARM |
|---|---|---|---|---|---|
| V0 | Sun | Svn | Swn | NON-DETECTION | NON-DETECTION |
| V1 | Sup | Svn | Swn | Iu | Iu |
| V2 | Sup | Svp | Swn | -Iw | Iu, Iv |
| V3 | Sun | Svp | Swn | Iv | Iv |
| V4 | Sun | Svp | Swp | -Iu | Iv, Iw |
| V5 | Sun | Svn | Swp | Iw | Iw |
| V6 | Sup | Svn | Swp | -Iv | Iu, Iw |
| V7 | Sup | Svp | Swp | NON-DETECTION | Iu, Iv, Iw |

CURRENT DETECTION APPARATUS AND CONTROL APPARATUS OF ROTARY ELECTRIC MACHINE

CROSS REFERENCE TO RELATED APPLICATIONS

This application is based on and claims the benefit of priority from Japanese Patent Application 2016-001805 filed on Jan. 7, 2016, the disclosure of which is incorporated in its entirety herein by reference.

TECHNICAL FIELD

The present disclosure relates to a current detection apparatus for application to a power system, and a control apparatus including such a current detection apparatus. The power system includes a direct-current (DC) power supply, and an inverter that includes a plurality of series-connected upper- and lower-arm switches. The inverter is connected to the DC power supply via buses. The power system also includes a rotary electric machine connected to the inverter.

BACKGROUND

An example of such current detection apparatuses, which is disclosed in Japanese Patent Application Publication No. 2004-64903, is configured to detect a bus current flowing through a negative bus as a phase current that will flow through a rotary electric machine in a period during which the vector of an output voltage of an inverter is an active voltage vector.

SUMMARY

Another current detection apparatus is applied for an inverter composed of plural pairs of upper- and lower-arm switches; the plural pairs of upper- and lower-arm switches correspond to the respective phases of a rotary electric machine.

Specifically, the current detection apparatus current detection apparatus uses at least first and second phase switches selected in one of the upper set of the upper-arm switches and the lower set of the lower-arm switches; the first and second phase switches are respectively defined as first and second detection switches.

The current detection apparatus is configured to detect at least (1) A first phase current, which flows through the rotary electric machine, based on the potential difference between the input and output terminals of the first detection switch while the first detection switch is in an on state (2) A second phase current, which flows through the rotary electric machine, based on the potential difference between the input and output terminals of the second detection switch while the second detection switch is in the on state.

When a current flows between the input and output terminals of each detection switch, the potential differences between the input and output terminals of the respective first and second detection switches vary based on the individual differences and the temperatures of the respective first and second detection switches.

Variations in the potential differences between the input and output terminals of the respective first and second detection switches may cause the amplitudes of the first and second phase currents to vary. Controlling a controlled variable of the rotary electric machine using the first and second phase currents whose amplitudes vary may result in a reduction in the controllability of the controlled variable, such as a variation in the controlled variable.

In view of the circumstances set forth above, a first aspect of the present disclosure seeks to provide current detection apparatuses, each of which is capable of reducing variations between the amplitudes of at least two phase currents flowing in a multiphase rotary electric machine.

A second aspect of the present disclosure seeks to provide control apparatuses for controlling a multiphase rotary electric machine, each of which includes the current detection apparatus according to the first aspect of the present disclosure.

According to a first exemplary aspect of the present disclosure, there is provided a current detection apparatus for application to a system. The system includes a direct-current power supply, an inverter including plural pairs of series-connected upper-arm switches and lower-arm switches, and a multi-phase rotary electric machine connected to the inverter. The upper- and lower-arm switches of each pair are connected to a corresponding one phase of the multi-phase rotary electric machine. An upper set of the upper-arm switches is connected to the direct-current power supply via a first bus, and a lower set of the lower-arm switches is connected to the direct-current power supply via a second bus. First and second phase switches selected in one of the upper set of the upper-arm switches and the lower set of the lower-arm switches are respectively defined as first and second detection switches. The first and second phase switches correspond to first and second phases of the multi-phase rotary electric machine. The current detection apparatus includes an arm current detection unit configured to detect each of at least first and second phase currents having respective amplitudes and flowing in the multiphase rotary electric machine based on a potential difference between input and output terminals of the corresponding one of the first and second detection switches while the corresponding one of the first and second detection switches is on. The current detection apparatus includes a bus current detection unit configured to detect each of at least bus-based first and second phase currents corresponding to the first and second phases of the multiphase rotary electric machine based on a current flowing through one of the first and second buses. The current detection apparatus includes an amplitude correction unit configured to correct the first and second phase currents detected by the arm current detection unit based on the bus-based first and second phase currents detected by the bus current detection unit such that the amplitudes of the respective first and second phase currents detected by the arm current detection unit match with each other.

According to a second exemplary aspect of the present disclosure, there is provided a control apparatus for controlling a controlled variable of a multiphase rotary electric machine of a system. The system includes a direct-current power supply, and an inverter including plural pairs of series-connected upper-arm switches and lower-arm switches and connected to the multi-phase rotary electric machine. The upper- and lower-arm switches of each pair are connected to a corresponding one phase of the multi-phase rotary electric machine. An upper set of the upper-arm switches is connected to the direct-current power supply via a first bus, and a lower set of the lower-arm switches is connected to the direct-current power supply via a second bus. First and second phase switches selected in one of the upper set of the upper-arm switches and the lower set of the lower-arm switches are respectively defined as first and second detection switches. The first and second phase switches correspond to respective first and second phases of the multi-phase rotary electric machine. The control apparatus includes the current detection apparatus according to the first exemplary aspect. The control apparatus includes a current selection unit configured to use a modulation rate of an output voltage of the inverter to select, as controlling phase currents for controlling the controlled variable of the multiphase rotary electric machine, one of (1) The at least first and second phase currents detected by the arm current detection unit (2) The at least bus-based first and second phase currents detected by the bus current detection unit.

The amplitude correction unit is configured to correct the first and second phase currents detected by the arm current detection unit when the current selection unit selects, as the controlling phase currents for controlling the controlled variable of the multiphase rotary electric machine, the at least first and second phase currents detected by the arm current detection unit.

This configuration of each of the first and second exemplary aspects reduces variations between the amplitudes of the at least first and second phase currents detected by the arm current detection unit. This results in the controllability of the controlled variable of the multiphase rotary electric machine based on the at least first and second phase currents detected by the arm current detection unit being maintained at a higher level, thus reducing fluctuations in the controlled variable of the multiphase rotary electric machine.

BRIEF DESCRIPTION OF THE DRAWINGS

Other aspects of the present disclosure will become apparent from the following description of an embodiment with reference to the accompanying drawings in which:

FIG. 2 is a table schematically illustrating the relationships among (I) voltage vectors of an output voltage of an inverter, (II) phase currents detectable based on a bus current, and (III) phase currents detectable based on arm currents according to the first embodiment;

FIG. 3 is a timing chart schematically illustrating an example of detection timings of the arm currents and the bus current according to the first embodiment;

DETAILED DESCRIPTION OF EMBODIMENT

First Embodiment

The following describes a motor system 100 including a control apparatus 30, which includes current detection apparatus 1, for controlling a motor 10 as an example of rotary electric machines according to the first embodiment of the present disclosure with reference to the accompanying drawings.

Figure 1:
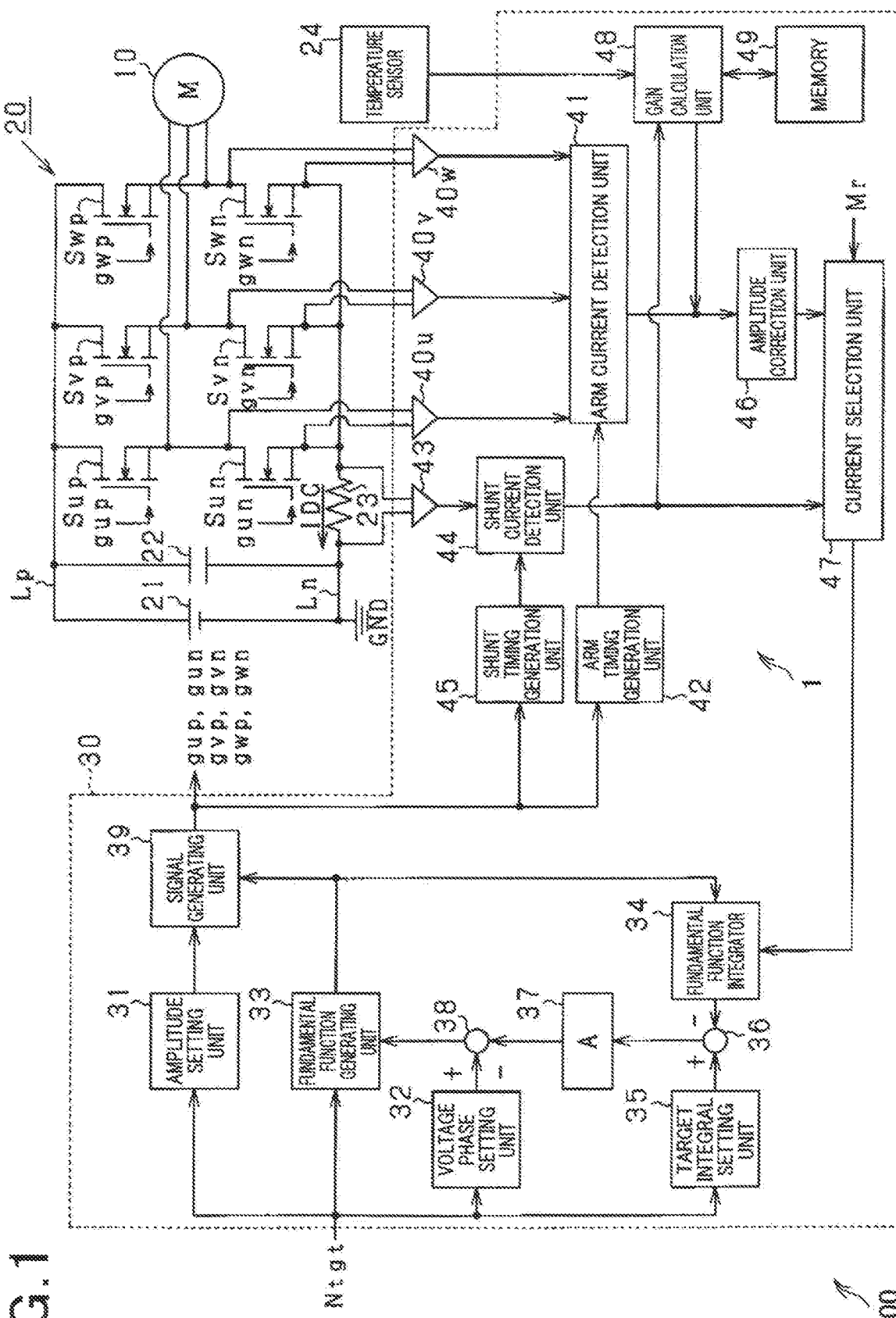
FIG. 1 is a circuit and block diagram schematically illustrating an example of the overall structure of a motor system according to the first embodiment of the present disclosure.

As illustrated in FIG. 1, the motor system 100 includes the motor 10, an inverter 20, and the control apparatus 30. The first embodiment uses a three-phase synchronous motor, such as three-phase permanent magnet synchronous motor, as the motor 10. The first embodiment uses the motor 10 to drive vehicle-mounted auxiliary devices, such as a radiator fan, a blower of an air conditioner, and a water pump.

The inverter 20 includes a first pair of series-connected upper- and lower-arm switches Sup and Sun, a second pair of series-connected upper- and lower-arm switches Svp and Svn, and a third pair of series-connected upper- and lower-arm switches Swp and Swn; the number of pairs of switches corresponds to the number of, for example thee, phases of the motor 10.

For example, the motor 10 includes a direct axis (d-axis) in line with a direction of magnetic flux created by an N pole of at least one pair of permanent magnets thereof. For example, the motor 10 also includes a quadrature axis (q-axis) with a phase being π/2-radian electrical angle leading with respect to a corresponding d-axis during rotation of the motor 10. In other words, the q-axis is electromagnetically perpendicular to the d-axis. The d and q axes constitute a d-q coordinate system, i.e. a two-phase rotating coordinate system, defined in the motor 10.

The motor 10 also includes unillustrated three-phase windings, such as U-, V-, and W-phase windings.

The connection point between upper- and lower-arm switches Sup and Sun is connected to a first end of the U-phase winding of the motor 10, and the connection point between upper- and lower-arm switches Svp and Svn is connected to a first end of the V-phase winding of the motor 10. The connection point between upper- and lower-arm switches Swp and Swn is connected to a first end of the W-phase winding of the motor 10.

Second ends of the U-, V-, and W-phase windings are connected to a common junction, i.e. a neutral point, in, for example, a star-configuration (Y-configuration). Note that the first embodiment uses voltage-controlled semiconductor switching elements, such as N channel MOSFETs, as the respective switches Sup, Sun, Svp, Svn, Swp, and Swn. Intrinsic diodes are connected in anti-parallel to the respective switches Sup, Sun, Svp, Svn, Swp, and Swn.

Drains, which are input terminals of the U-, V-, and W-phase upper-arm switches Sup, Svp, and Swp, are connected to a positive bus Lp. Sources, which are output terminals of the U-, V-, and W-phase lower arm switches Sun, Svn, and Swn, are connected to a negative bus Ln. The positive bus Lp is connected to a positive terminal of a battery 21, which serves as a direct-current (DC) power source. The negative bus Ln is connected to a negative terminal of the battery 21.

The motor system 100 also includes a smoothing capacitor 22 connected between the positive bus Lp and the negative bus Ln in parallel to the battery 21.

The motor system 100 further includes a shunt resistor 23 provided on the negative bus Ln. The shunt resistor 23 is located on the negative bus Ln to be closer to the negative terminal of the battery 21 than the connection points to the respective lower-arm switches Sun, Svn, and Swn are. The shunt resistor 23 serves to measure a current flowing therethrough.

Additionally, the motor system 100 includes a temperature sensor 24, which serves as, for example, a temperature measuring unit. The temperature sensor 24 is operative to measure the temperature of the shunt resistor 23.

The control apparatus 30 mainly includes a microprocessor, and drives the inverter 20 to control the rotational speed of the motor 10 at a commanded rotational speed Ntgt; the rotational speed is an example of controlled variables of the motor 10. The control apparatus 30 according to the first embodiment specially controls the rotational speed of the motor 10 using a method described in Japanese Patent Application Publication No. 2004-64860 (see FIG. 1) without using information on the rotational angle of the motor 10, which is usually measured by a rotation angle sensor, such as a Hall element or resolver. The following describes this specific control of the rotational speed of the motor 10 hereinafter.

The control apparatus 30 includes an amplitude setting unit 31, a voltage phase setting unit 32, a fundamental function generation unit 33, and a fundamental function integrator 34. The control apparatus 30 also functionally includes a target integral setting unit 35, a first deviation calculation unit 36, a gain multiplication unit 37, a second deviation calculation unit 38, and a signal generation unit 39. These units 31 to 39 of the control apparatus 30 can be implemented as hardware modules, software modules, and/or hardware-software hybrid modules.

The amplitude setting unit 31 sets a voltage amplitude, which is the amplitude of a voltage vector of the inverter 20, on the basis of the commanded rotational speed Ntgt of the motor 10. The voltage amplitude according to the first embodiment is defined as the square root of the sum of the square value of a d-axis voltage Vd and the square value of a q-axis voltage Vq. The d- and q-axis voltages Vd and Vq are d- and q-axis components of the output voltage vector in the two-phase rotating coordinate system of the motor 10. For example, the amplitude setting unit 31 can set the voltage amplitude based on a map where values of the commanded rotational speed Ntgt are associated with corresponding values of the voltage amplitude. Moreover, the commanded rotational speed Ntgt is input into the control apparatus 30 from, for example, a higher-level control apparatus than the control apparatus 30.

The voltage phase setting unit 32 sets a voltage-phase fundamental value, which is a fundamental value of the phase of the voltage vector, on the basis of the commanded rotational speed Ntgt. The phase of the voltage vector is defined as, for example, an angle formed by the d-axis and the voltage vector. For example, the voltage phase setting unit 32 can set the voltage-phase fundamental value based on a map where values of the commanded rotational speed Ntgt are associated with the corresponding voltage-phase fundamental values.

The fundamental function generation unit 33 determines an electrical angular velocity of the motor 10 based on the commanded rotational speed Ntgt. Then, the fundamental function generation unit 33 generates a sinusoidal fundamental function of a voltage applied to each of the three phases, i.e. three-phase windings, of the motor 10 on the basis of the determined electrical angular velocity and a corrected value of the voltage-phase fundamental value for the corresponding phase set by the voltage phase setting unit 32. The correction of the voltage-phase fundamental value for each phase set by the voltage phase setting unit 32 is carried out by a second deviation calculation unit 38 described below. The sinusoidal fundamental functions of the voltages applied to the respective three phases of the motor 10 are sinusoidal signals that have a phase difference of 120 electrical degrees from each other.

The fundamental function integrator 34 integrates the sinusoidal fundamental function for each phase generated by the fundamental function generation unit 33 over a predetermined integration period to calculate a fundamental function integral. The fundamental function integrator 34 for example determines the integration period based on currents, which are selected and output from a current selection unit 47 described later; the fundamental function integrator 34 constitutes the current detection apparatus 1 described later.

The fundamental function integral for each phase represents a value correlating with the phase difference between a corresponding phase current flowing in the motor 10 and the sinusoidal fundamental function for the corresponding phase.

The target integral setting unit 35 sets, for each phase, a target integral on the basis of the commanded rotational speed Ntgt; the target integral for each phase is an integral of the corresponding sinusoidal fundamental function. The integral of the sinusoidal fundamental function for each phase matches with a target phase difference between a corresponding phase current flowing in the motor 10 and the corresponding sinusoidal fundamental function. For example, the target integral setting unit 35 can set the target integral based on a map where values of the commanded rotational speed Ntgt are associated with the corresponding values of the target integral.

The first deviation calculation unit 36 subtracts, for each phase, the corresponding fundamental function integral calculated by the fundamental function integrator 34 from the corresponding target integral set by the target integral setting unit 35. This calculates, for each phase, the deviation between the corresponding fundamental function integral and the corresponding target integral.

The gain multiplication unit 37 multiplies, for each phase, the deviation between the corresponding fundamental function integral and the corresponding target integral by a predetermined gain A. This calculates a multiplication value for each phase.

The second deviation calculation unit 38 subtracts, for each phase, the corresponding multiplication value, which is the product of the gain A and the deviation between the corresponding fundamental function integral and the corresponding target integral, from the voltage-phase fundamental value set by the voltage phase setting unit 32. This corrects the voltage phase fundamental value for each phase. Then, the second deviation calculation unit 38 sends the corrected voltage-phase fundamental value for each phase to the fundamental function generation unit 33, so that the fundamental function generation unit 33 uses the corrected voltage-phase fundamental value for each phase to thereby generate the sinusoidal fundamental functions of the voltage applied to the respective three-phases of the motor 10.

The signal generator 39 generates drive signals gup, gun, gvp, gvn, gwp, and gwn, which are PWM signals, based on the voltage amplitude set by the amplitude setting unit 31 and the sinusoidal fundamental functions for the respective phases generated by the fundamental function generation unit 33 using known three-phase modulation. Then, the signal generator 39 outputs the drive signals gup, gun, gvp, gvn, gwp, and gwn to the control terminals of the respective switches Sup, Sun, Svp, Svn, Swp, and Swn of the inverter 20, thus individually turning on or off the respective switches Sup, Sun, Svp, Svn, Swp, and Swn.

Specifically, the signal generation unit 39 calculates U-, V-, W-phase command duties Dutyu, Dutyv, and Dutyw based on the voltage amplitude and the sinusoidal fundamental functions; the U-, V-, W-phase command duties Dutyu, Dutyv, and Dutyw have a phase difference of 120 electrical degrees from each other.

The command duties Dutyu, Dutyv, and Dutyw according to the first embodiment are sinusoidal signals, and are normalized by the voltage across the battery 21.

The signal generation unit 39 performs pulse width modulation based on comparison between each of the command duties Dutyu, Dutyv, and Dutyw and a carrier signal SigC, thus generating a corresponding one of the drive signals gup, gun, gvp, gvn, gwp, and gwn. In the first embodiment, the carrier signal SigC is a triangle wave signal where the signal up-sweep and signal down-sweep of the triangular wave signal are equal but opposite in sign. The drive signals gup, gvp, and gwp on the upper-arm side and the corresponding drive signals gun, gvn, and gwn on the lower-arm side are complemental signals to each other. In other words, the upper-arm switch and the lower-arm switch of each phase are alternately turned on.

The control apparatus 30 includes the current detection apparatus 1 that detects the phase currents used to control the rotational speed of the motor 10. The current detection apparatus 1 performs the process of detecting the phase currents on the basis of the voltage drops across the shunt resistor 23, and the process of detecting the phase currents on the basis of input-output voltages, i.e. source-drain voltages, of the lower-arm switches of at least two phases. In the first embodiment, the lower-arm switches correspond to respective detection switches.

The following describes the process of detecting the phase currents on the basis of the voltage drops across the shunt resistor 23 first.

As illustrated in FIG. 2, one phase current in accordance with the voltage vector flows through the shunt resistor 23 in each period during which the voltage vector of the inverter 20 is a corresponding one of active voltage vectors V1 to V6. One phase current in accordance with the voltage vector can be therefore detected on the basis of the voltage drop across the shunt resistor 23. Each of two active voltage vectors appears twice in one cycle of the carrier signal SigC between the rising edge and the falling edge of the carrier signal SigC. Accordingly, each of two phase currents can be detected twice in one cycle of the carrier signal SigC. FIG. 3 illustrates an example where, in one cycle of the carrier signal SigC, 1. A bus current IDC, flowing through the negative bus Ln, is detected as a W-phase current Iw in a period during which the voltage vector is the even-numbered voltage vector V2

2. The bus current IDC is detected as a U-phase current Iu in a period during which the voltage vector is an odd-numbered voltage vector V1.

Figure 4A:
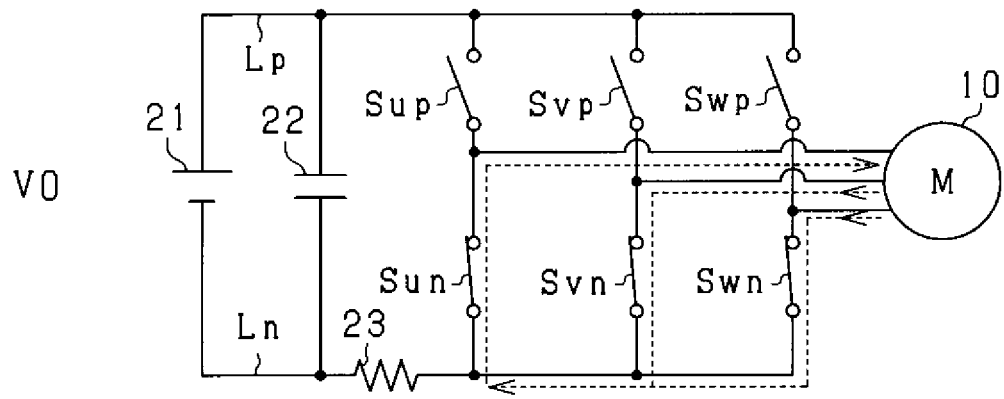
FIGS. 4(a) to 4(c) are circuit diagrams each illustrating a corresponding one of the current distribution modes of a corresponding one of the voltage vectors V0, V1, and V2 according to the first embodiment.
Figure 4B:
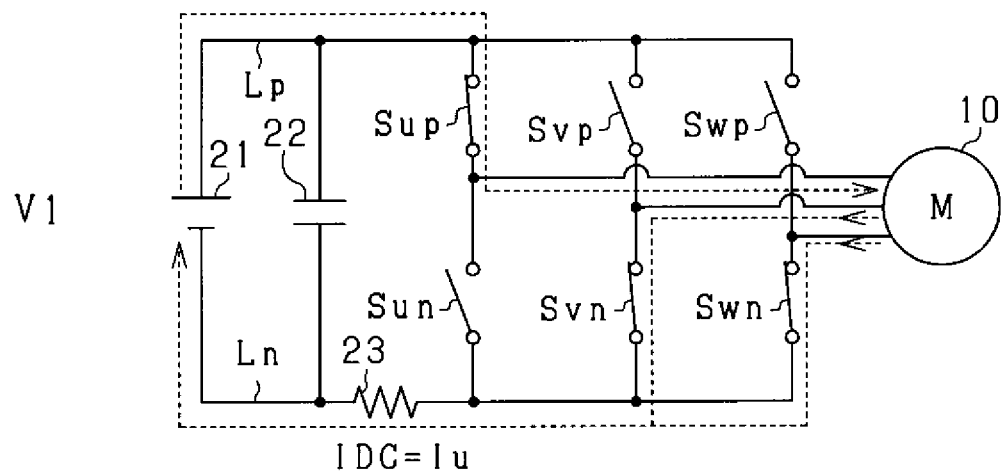
Figure 4C:
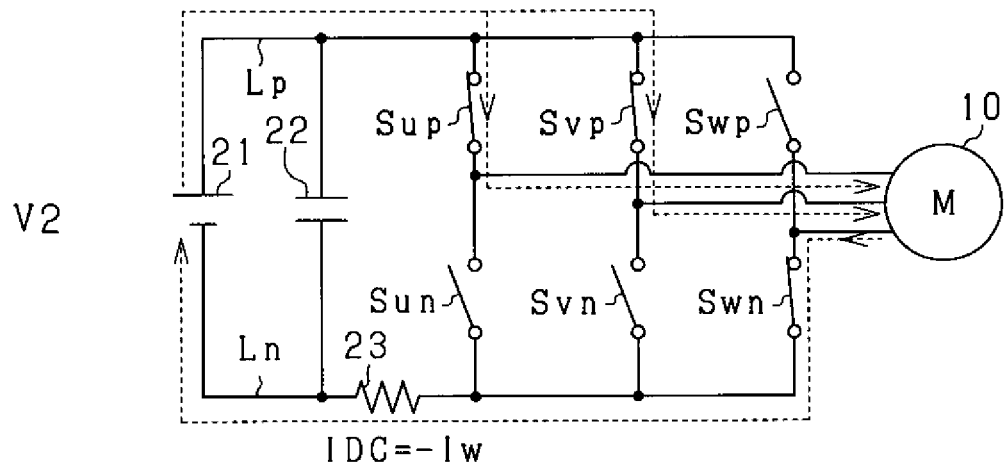

FIG. 4($b$) illustrates that the U-phase current Iu can be detected on the basis of the voltage drop across the shunt resistor 23 in the period during which the voltage vector is the odd-numbered voltage vector V1.

Moreover, FIG. 4($c$) illustrates that the W-phase current Iw can be detected on the basis of the voltage drop across the shunt resistor 23 in the period during which the voltage vector is the even-numbered voltage vector V2.

In the first embodiment, the direction in which a current flowing from the side of the inverter 20 to the side of the negative terminal of the battery through the shunt resistor 23 is defined as a positive direction. Moreover, the direction of a current flowing from the side of the inverter 20 to the side of the motor 10 is defined as a positive direction. The negative sign is therefore assigned for a bus current IDC in the field "1 SHUNT (IDC)" of FIG. 2 when the sign of a phase current detected by the shunt resistor 23 is different from that of a corresponding actual phase current.

As illustrated in FIG. 1, the current detection apparatus 1 includes an amplifier 43, a shunt current detection unit 44 serving as, for example, a bus current detection unit, and a shunt timing generation unit 45; the units 43, 44, and 45 aim to detect a phase current on the basis of a corresponding value of the voltage drop across the shunt resistor 23.

The amplifier 43 amplifies and outputs a signal indicative of a value of the voltage drop across the shunt resistor 23 based on a phase current flowing through the shunt resistor 23 as the bus current IDC.

The shunt current detection unit 44 detects the output signal of the amplifier 43 as one phase current at a detection timing instructed by the shunt timing generation unit 45. The shunt timing generation unit 45 calculates the voltage vector from the relationship, illustrated in FIG. 2, between the drive signals and the voltage vector on the basis of the drive signals output from the signal generation unit 39. When determining that the calculated voltage vector is one of the active voltage vectors V1 to V6, the shunt timing generation unit 45 instructs the phase current detection timing to the shunt current detection unit 44.

Specifically, the shunt timing generation unit 45 instructs, as the detection timing, for example, a timing when a specified time Tsta passes after the timing of determining that the calculated voltage vector is one of the active voltage vectors V1 to V6. The specified time Tsta is set to, for example, a period of time from when the voltage vector is switched to when ringing of the phase current converges.

Next, the following describes the process of detecting phase currents on the basis of the voltages between the sources and the drains of the respective U-, V-, and W-phase lower arm switches Sup, Svp, and Swp.

As illustrated in FIG. 2, one to three phase currents flows through the lower arm switches, each of which is in an ON period, in accordance with the voltage vectors V0 to V6. The control of the rotational speed of the motor 10 requires at least two phase currents. In the first embodiment, three phase currents are detected on the basis of the voltages between the sources and the drains of the respective U-, V-, and W-phase lower arm switches in the period during which the voltage vector is the zero voltage vector V0.

FIG. 3 illustrates an example where an arm current detection unit 41, which is described later, detects U-, V-, and W-phase currents Irmu, Irmv, and Irmw at a timing when the carrier signal SigC reaches an extrema in the period during which the voltage vector is the zero voltage vector V0.

In the first embodiment, the sign of the voltage between the source and the drain of a lower-arm switch when the drain potential of the lower-arm switch is higher than its source potential is defined as positive. Moreover, the direction in which an actual phase current flows from the side of the inverter 20 to the side of the motor 10 is defined as the positive direction as described above. The negative sign is therefore assigned for a bus current IDC in the field "1 SHUNT (IDC)" of FIG. 2 when the sign of a phase current detected by the shunt resistor 23 is different from that of a corresponding actual phase current.

FIG. 4(a) illustrates that the U-, V-, and W-phase currents can be detected on the basis of the voltages between the sources and the drains of the respective U-, V-, and W-phase lower arm switches Sun, Svn, and Swn in the period during which the voltage vector is the zero voltage vector V0.

As illustrated in FIG. 1, the current detection apparatus 1 includes U-, V-, and W-phase amplifiers 40u, 40v, and 40w, the arm current detection unit 41, and an arm timing generation unit 42; these units 40u, 40v, and 40w, 41, and 42 aim to detect phase currents on the basis of the voltages between the sources and the drains of the respective lower arm switches Sun, Svn, and Swn. The U-, V-, and W-phase amplifiers 40u, 40v, and 40w amplify and output the voltages between the sources and the drains of the respective U-, V-, and W-phase lower arm switches Sun, Svn, and Swn.

The arm current detection unit 41 detects the output signals of the amplifiers 40u, 40v, and 40w as three phase currents at a detection timing instructed by the arm timing generation unit 42.

The arm timing generation unit 42 calculates the voltage vector on the basis of the drive signals output from the signal generation unit 39. The arm timing generation unit 42 instructs the phase current detection timing to the arm current detection unit 41 when determining that the calculated voltage vector is the zero voltage vector V0.

Specifically, the arm timing generation unit 42 instructs, for example, at least one of a timing when the carrier signal SigC reaches a maximum value and a timing when the carrier signal SigC reaches a minimum value as the detection timing in the period of the zero voltage vector V0, on the condition that the period of the zero voltage vector V0 is determined to be equal to or more than twice as long as the specified time Tsta. The condition that the period of the zero voltage vector V0 is equal to or more than the period that is twice as long as the specified time Tsta is to avoid the detection timing from being included in the period during which ringing occurs.

The current detection unit 1 includes a current selection unit 47.

The phase current detected by the arm current detection unit 41 is corrected by an amplitude correction unit 46 described below, and then input to the current selection unit 47. The phase current detected by the shunt current detection unit 44 is also input to the current selection unit 47.

The current selection unit 47 selects at least one of the phase current detected by the arm current detection unit 41 and the phase current, i.e. a bus-based phase current, detected by the shunt current detection unit 44 as the phase current used to control the rotational speed of the motor 10, on the basis of a modulation rate Mr of the output voltage of the inverter 20.

In the first embodiment, the modulation rate Mr corresponds to the amplitude of each command duty. The current selection unit 47 is operative to avoid a reduction in the detection accuracy of the phase current due to the occurrence of ringing in the phase current immediately after the voltage vector is switched.

Figure 5:
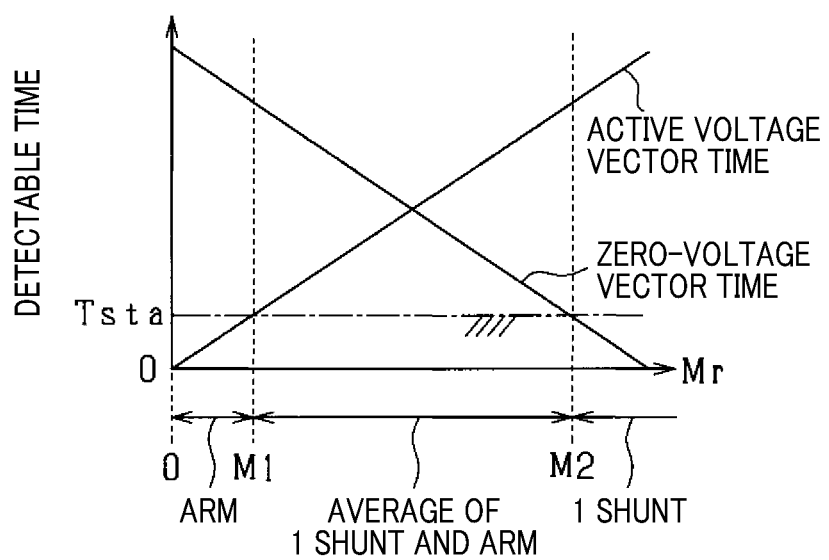
FIG. 5 is a graph schematically illustrating the relationships among (I) a modulation rate of the output voltage of the inverter, (II) a detectable time of an active voltage vector, and (III) a detectable time of a zero voltage vector according to the first embodiment.
Figure 6A:
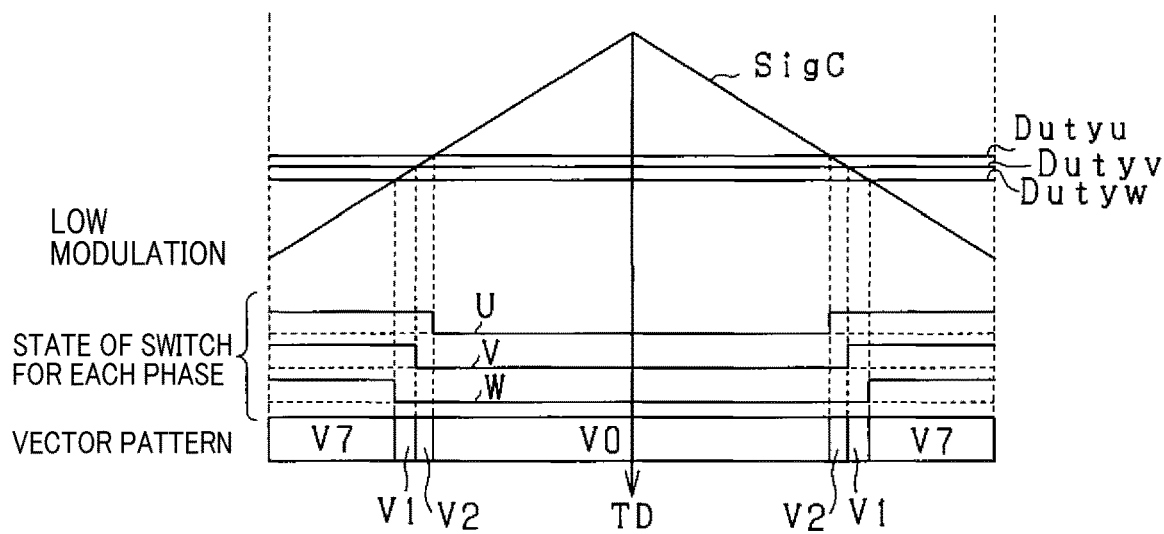
FIG. 6(a) is a timing chart schematically illustrating an example of the detection timings of phase currents when the modulation factor is in a low modulation region according to the first embodiment.

When determining that the modulation rate Mr is in a low modulation region, the current selection unit 47 selects and outputs three phase currents output from the amplitude correction unit 46. The low modulation region is a region that is equal to or more than zero and less than a first specified value M1 as illustrated in FIG. 5. The first specified value M1 is for example set to a value of the modulation rate at which a period of time, during which the voltage vector Mr is the active voltage vector, is equal to the specified time Tsta from when the voltage vector is switched to when ringing converges. The time of the active voltage vector increases with increasing modulation rate Mr. FIG. 6(a) illustrates that, when the modulation rate Mr is in the low modulation region, the timing when the carrier signal SigC reaches a maximum value becomes a phase current detection timing TD in the period of the zero voltage vector V0.

When determining that the modulation rate Mr is in a middle modulation region higher than the low modulation region, the current selection unit 47 outputs an average of the phase current detected by the arm current detection unit 41 and the phase current detected by the shunt current detection unit 44, for each of the three phases. As illustrated in FIG. 5, the middle modulation region is a region that is equal to or more than the first specified value M1 and less than a second specified value M2. The reason why the current selection unit 47 calculates the average is to reduce, even if noise is mixed into one of the phase current detected by the arm current detection unit 41 and the phase current detected by the shunt current detection unit 44, the influence of the mixture into one of the phase current detected by the arm current detection unit 41 and the phase current detected by the shunt current detection unit 44. The second specified value M2 is set to a value of the modulation rate at which the period of time, during which the voltage vector is the zero voltage vector, is equal to the specified time Tsta. The time of the zero voltage vector decreases with increasing modulation rate Mr.

Figure 6B:
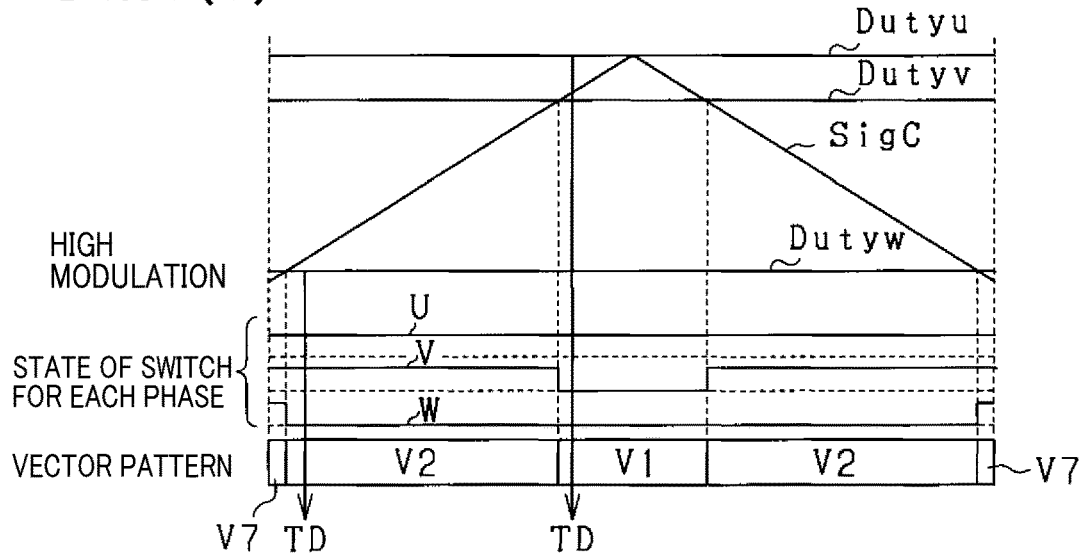
FIG. 6(b) is a timing chart schematically illustrating an example of the detection timings of phase currents when the modulation factor is in high modulation region according to the first embodiment.

When determining that the modulation rate Mr is in a high modulation region higher than the middle modulation region, the current selection unit 47 sequentially outputs the three phase currents detected by the shunt current detection unit 44. The high modulation region is a region that is equal to or more than the second specified value M2. FIG. 6(b) illustrates that the phase current detection timing TD of the shunt current detection unit 44 is defined when the specified time Tsta passes after the voltage vector is switched to each of the active voltage vectors V1 and V2 during the period of a corresponding one of the active voltage vectors V1 and V2.

Figure 7:
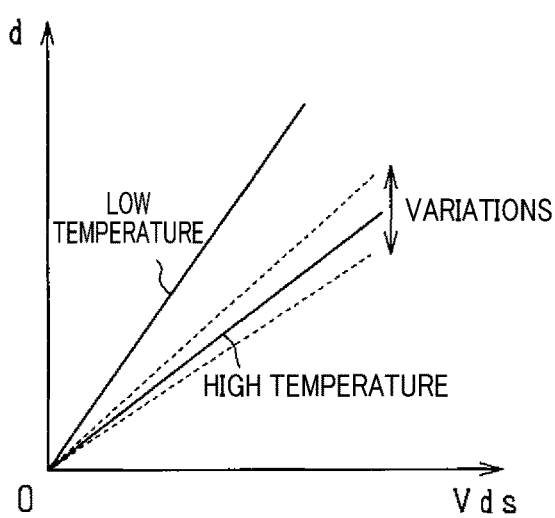
FIG. 7 is a graph schematically illustrating variations in drain-source voltage drops across metal-oxide semiconductor field-effect transistors (MOSFETs) due to their individual differences and their temperatures according to the first embodiment.
Figure 8:
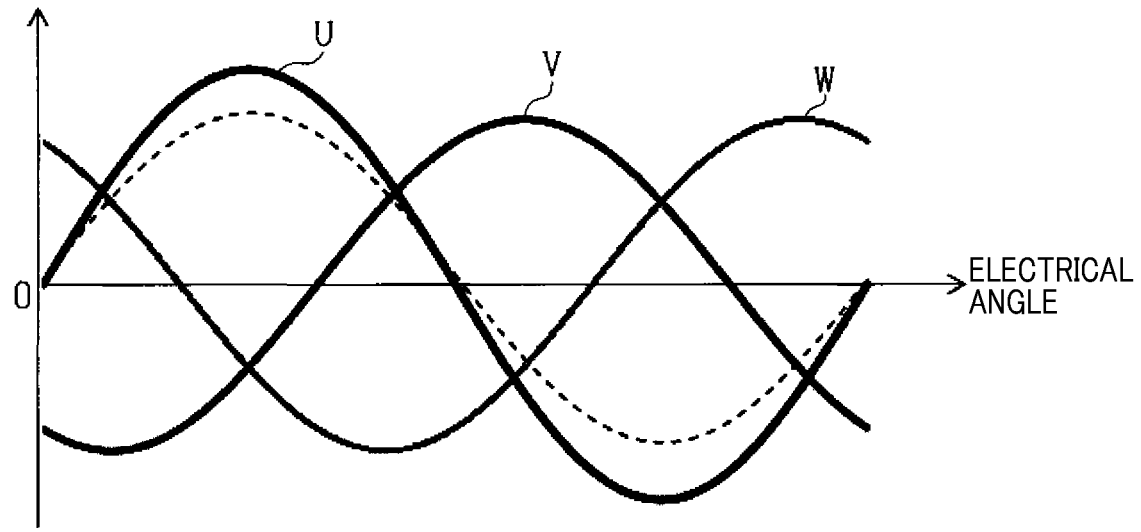
FIG. 8 is a graph schematically illustrating how the phase currents detectable based on the arm currents transition according to the first embodiment.

As illustrated in FIG. 7, voltages Vds between the sources and the drains of the respective lower-arm switches Sun, Svn, and Swn when a predetermined drain current Id flows through the lower-arm switches Sun, Svn, and Swn vary due to the individual differences and temperatures of the lower-arm switches Sun, Svn, and Swm. FIG. 7 illustrates variations resulting from the individual differences in a case where the switches become a high temperature. When the voltages Vds between the sources and the drains of the respective-phase switches vary, the amplitudes of the detected three phase currents vary. FIG. 8 illustrates an example where the amplitude of the U-phase current detected by the arm current detection unit 41 is offset from the amplitudes of the V-, and W-phase currents detected by the arm current detection unit 41.

When the phase currents whose amplitudes vary are used to control the rotational speed of the motor 10, the controllability of the rotational speed may decrease resulting in fluctuations in the rotational speed.

Figure 9:
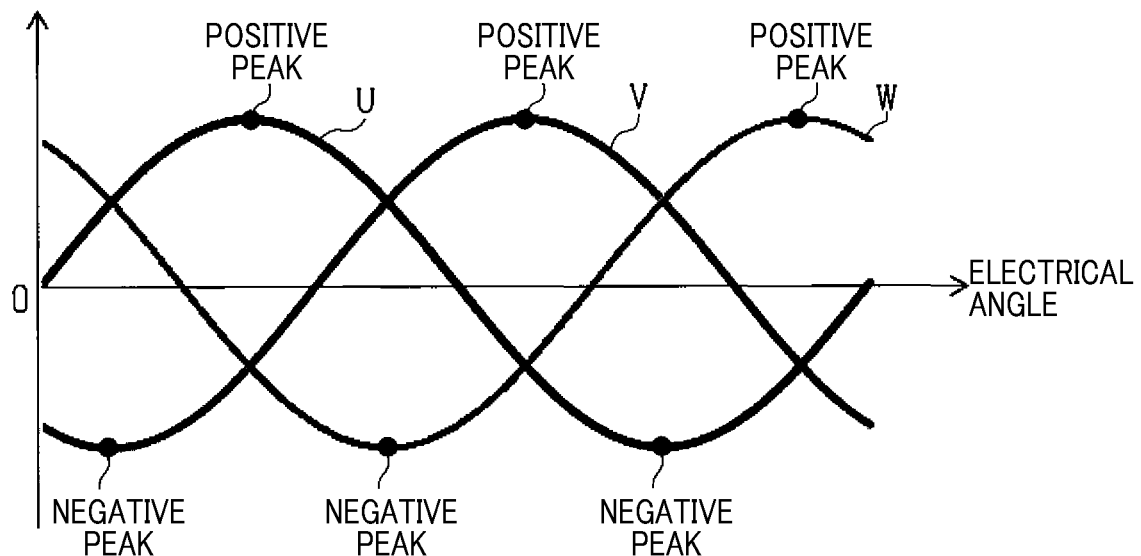
FIG. 9 is a time chart illustrating how the phase currents detectable based on the bus current transition according to the first embodiment.

The three phase currents detected by the arm current detection unit 41 vary due to the individual differences of the lower-arm switches Sun, Svn, and Swn, whereas the phase currents, i.e. bus-based phase currents, detected by the shunt current detection unit 44 do not vary due to the individual differences as illustrated in FIG. 9, because the shunt current detection unit 44 is a single current detection unit. Using the phase currents detected by the shunt current detection unit 44 therefore enables variations in the amplitudes of the phase currents detected by the arm current detection unit 41 to be reduced.

The current detection apparatus 1 according to the first embodiment specifically includes the amplitude correction unit 46 and a gain calculation unit 48 as illustrated in FIG. 1.

Figure 10:
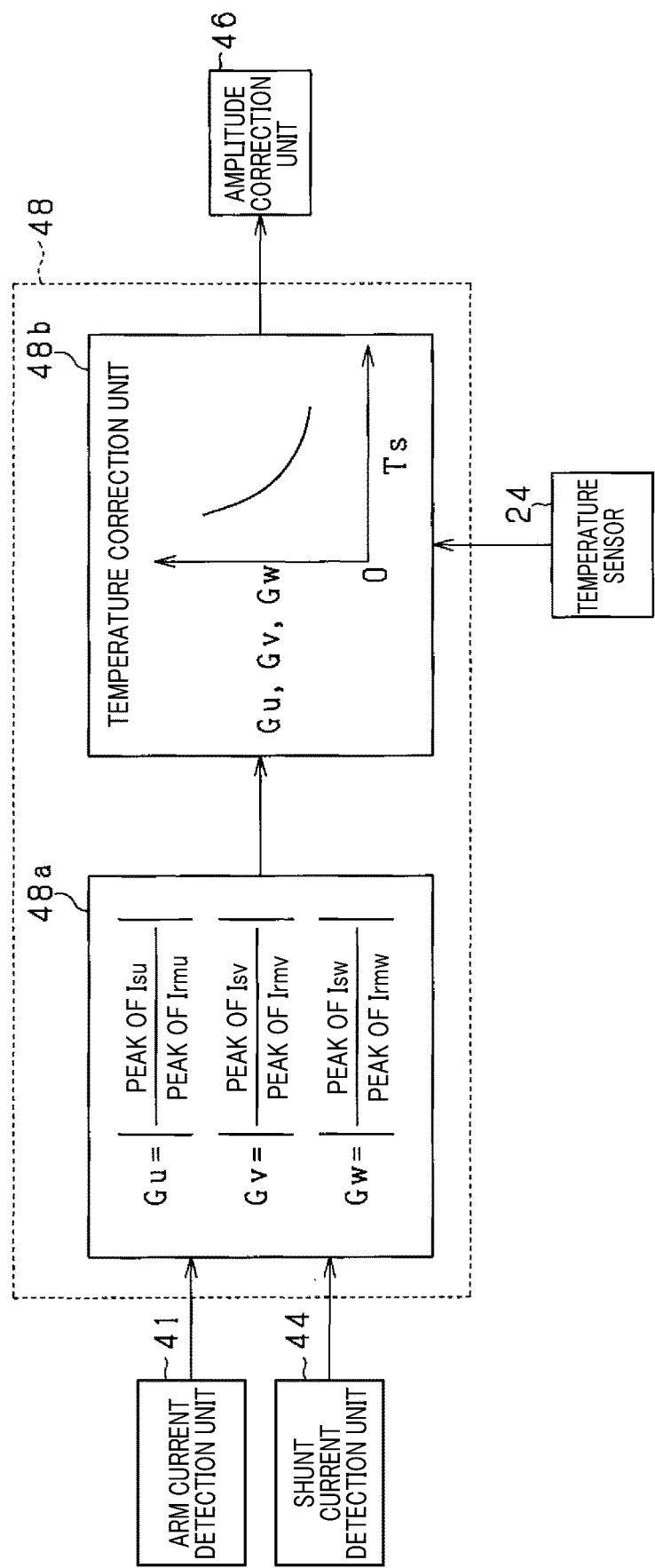
FIG. 10 is a block diagram schematically illustrating in detail a gain calculation unit illustrated in FIG. 1.

The gain calculation unit 48 includes a correction gain calculation unit 48a as illustrated in FIG. 10. The correction gain calculation unit 48a obtains peak values of the respective U-, V-, and W-phase currents Isu, Isv, and Isw sequentially detected by the shunt current detection unit 44 within the range of 180 electrical degrees as illustrated in FIG. 9. In the first embodiment, the sign of the peak value of each of the three phase currents is set as positive or negative. For example, the correction gain calculation unit 48a can be comprised of a peak hold circuit for detecting the peak value of each of the three phase currents.

The correction gain calculation unit 48a obtains peak values of the respective U-, V-, and W-phase currents Irmu, Irmv, and Irmw detected by the arm current detection unit 41. In the first embodiment, the sign of the peak value of each of the three phase currents is matched with the sign of the peak value of a corresponding one of the phase currents detected by the shunt current detection unit 44.

The correction gain calculation unit 48a divides the peak value Isu, Isv, Isw of each phase current, which are obtained form the shunt current detection unit 44, by the peak value Irmu, Irmv, Irmw of the corresponding one of the phase currents, which are obtained from the arm current detection unit 41, thus calculating the absolute value of the divided value as a correction gain Gu, Gv, Gw for each of the U, V, and W phases.

The gain calculation unit 48 also includes a temperature correction unit 48b. The temperature correction unit 48b performs a correction process such that the correction gain Gu, Gv, Gw for each phase decreases as the temperature of the shunt resistor 23 detected by the temperature sensor 24 increases; the temperature of the shunt resistor 23 is hereinafter referred to as a detected temperature Ts.

That is, the resistance value of the shunt resistor 23 increases as the temperature of the shunt resistor 23 increases. If a predetermined bus current flows through the shunt resistor 23, the voltage drop across the shunt resistor 23 increases as the temperature of the shunt resistor 23 increases. This results in the phase current detected by the shunt current detection unit 44 increasing. It is therefore necessary to correct each correction gain Gu, Gv, Gw such that the phase current detected by the shunt current detection unit 44 decreases as the detected temperature Ts increases.

Specifically, the temperature correction unit 48b according to the first embodiment corrects each correction gain Gu, Gv, Gw such that the corresponding correction gain Gu, Gv, Gw decreases as the detected temperature Ts increases. For example, the temperature correction unit 48b can use a method described below as an example of the method for correcting each correction gain Gu, Gv, Gw.

Specifically, if the detected temperature Ts is equal to a reference temperature Tref, the temperature correction unit 48b sets a temperature correction coefficient Kt (>0) to 1. In addition, the temperature correction unit 48b sets the temperature correction coefficient Kt to be smaller as the detected temperature Ts increases relative to the reference temperature Tref. The temperature correction unit 48b also sets the temperature correction coefficient Kt to be larger as the detected temperature Ts decreases with reference to the reference temperature Tref.

Then, the temperature correction unit 48b multiplies each correction gain Gu, Gv, Gw by the temperature correction coefficient Kt, thus correcting the corresponding correction gain Gu, Gv, Gw.

Each of the corrected correction gains Gu, Gv, Gw is input to the amplitude correction unit 46.

The amplitude correction unit 46 multiplies the phase currents Irmu, Irmv, Irmw detected by the arm current detection unit 41 by the respective correction gains Gu, Gv, Gw to correct the respective phase currents Irmu, Irmv, Irmw. This results in variations in the amplitudes of the respective phase currents Irmu, Irmv, and Irmw being reduced.

The control apparatus 30 according to the first embodiment includes a memory 49 serving as a storage unit. The correction gains Gu, Gv, and Gw output from the temperature correction unit 48b are stored in the memory 49. The memory 49 is operative to, for example, increase the opportunity of correction of the phase currents detected by the arm current detection unit 41.

Specifically, only the middle modulation region for the modulation rate enables the correction gains Gu, Gv, Gw to be calculated. In other words, the other low and high modulation regions for the modulation rate do not allow the correction gains Gu, Gv, Gw to be calculated. This is because calculation of the correction gains Gu, Gv, Gw requires the phase currents detected by the arm current detection unit 41 and the phase currents detected by the shunt current detection unit 44. The modulation rate Mr at the start of the motor 10 is located in the low modulation region. Accordingly, the correction gains Gu, Gv, Gw cannot be calculated at the start of the motor 10, so that the phase currents detected by the arm current detection unit 41 cannot be corrected.

In view of these circumstances, when the modulation rate Mr is located in the middle modulation region, the calculated correction gains Gu, Gv, and Gw are stored in the memory 49. This enables the phase currents detected by the arm current detection unit 41 to be corrected based on the correction gains Gu, Gv, and Gw stored in the memory 49 at the next start of the motor 10.

The first embodiment described above in detail achieves the following advantageous effects.

The current detection apparatus 1 is configured to correct three phase currents on the basis of the peak values of the phase currents detected by the arm current detection unit 41 and the peak values of the phase currents detected by the shunt current detection unit 44 such that the amplitudes of the three phase currents detected by the arm current detection unit 41 match with each other. This reduces variations in the amplitudes of the three phase currents due to the individual differences and the temperatures of the lower-arm switches. This results in the controllability of the rotational speed of the motor 10 being maintained at a higher level, thus reducing fluctuations in the rotational speed of the motor 10.

The current detection apparatus 1 is configured to correct the correction gains Gu, Gv, and Gw such that the correction gains Gu, Gv, and Gw decrease as the detected temperature Ts increases. This configuration enables the amplitudes of the respective three phase currents detected by the arm current detection unit 41 to be similar to the amplitudes of the actual phase currents. This therefore results in an increase of the accuracy of detecting the phase currents used to control the rotational speed of the motor 10.

The current detection apparatus 1 is configured to use the correction gains Gu, Gv, and Gw stored in the memory 49 to correct the phase currents detected by the arm current detection unit 41 during the start of the motor 10. This configuration enables, during the start of the motor 10, the phase currents detected by the arm current detection unit 41 to be corrected. This enables, even during the start of the motor 10, the accuracy of detecting the phase currents to be maintained at a higher level, thus maintaining the controllability of the rotational speed of the motor 10 at a higher level.

The current detection apparatus 1 is configured to detect the phase currents flowing in the motor 10 using the lower-arm switches. This configuration enables the potential at the ground GND of the negative terminal of the battery 21 to be used as a reference operation potential common to, for example, the amplifiers 43, 40u, 40v, and 40w. This configuration results in the circuit configuration of the current detection apparatus 1 to be simplified.

When determining that the modulation rate Mr is located in the middle modulation region, the current detection apparatus 1 is configured to use the average of the phase current detected by the arm current detection unit 41 and the phase current detected by the shunt current detection unit 44 for each phase to control the rotational speed of the motor 10. This configuration enables the influence of noise included in the phase current detection values on the rotational speed control to be reduced.

Second Embodiment

Figure 11:
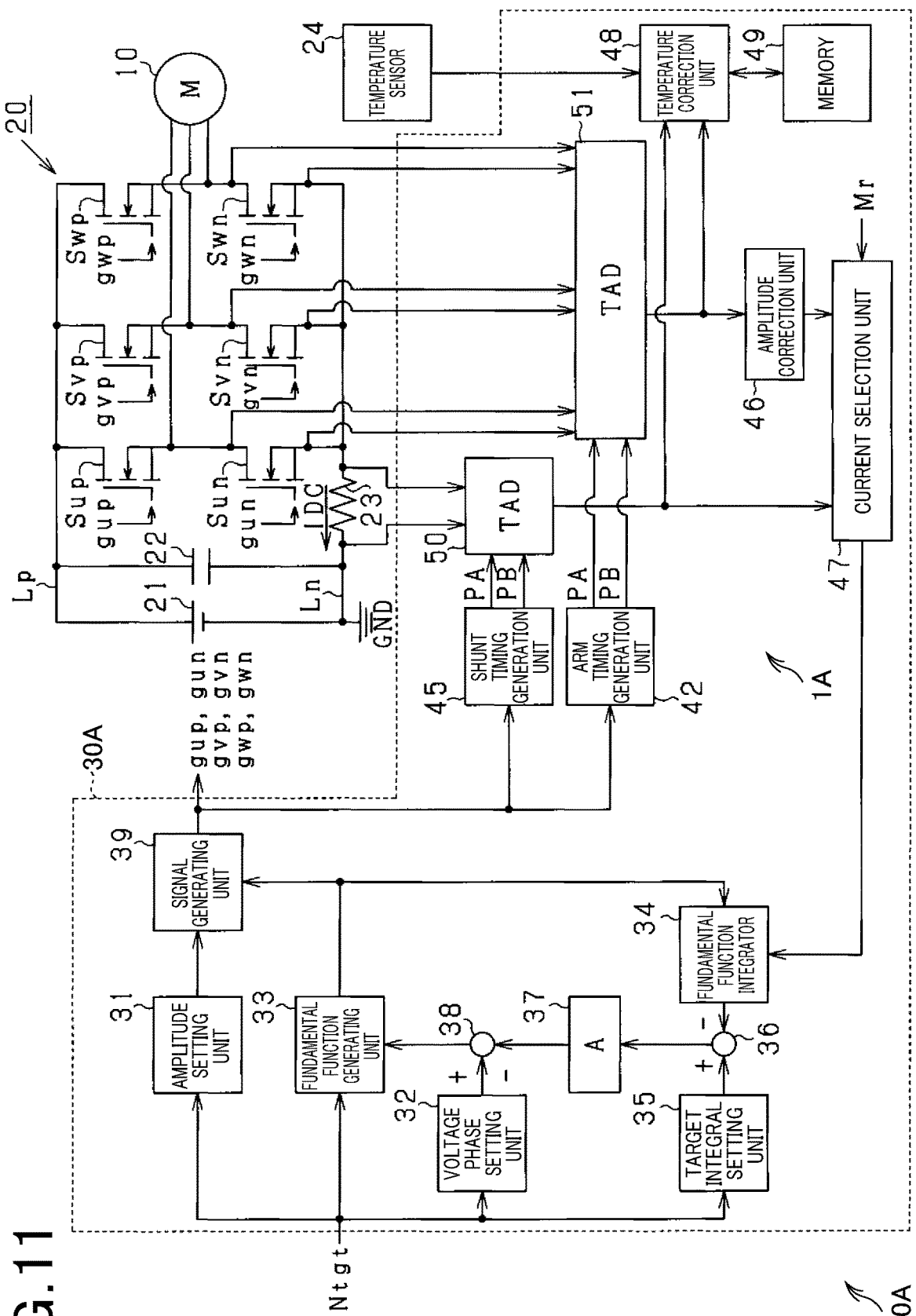
FIG. 11 is a circuit and block diagram schematically illustrating an example of the overall structure of a motor system according to the second embodiment of the present disclosure.
Figure 12:
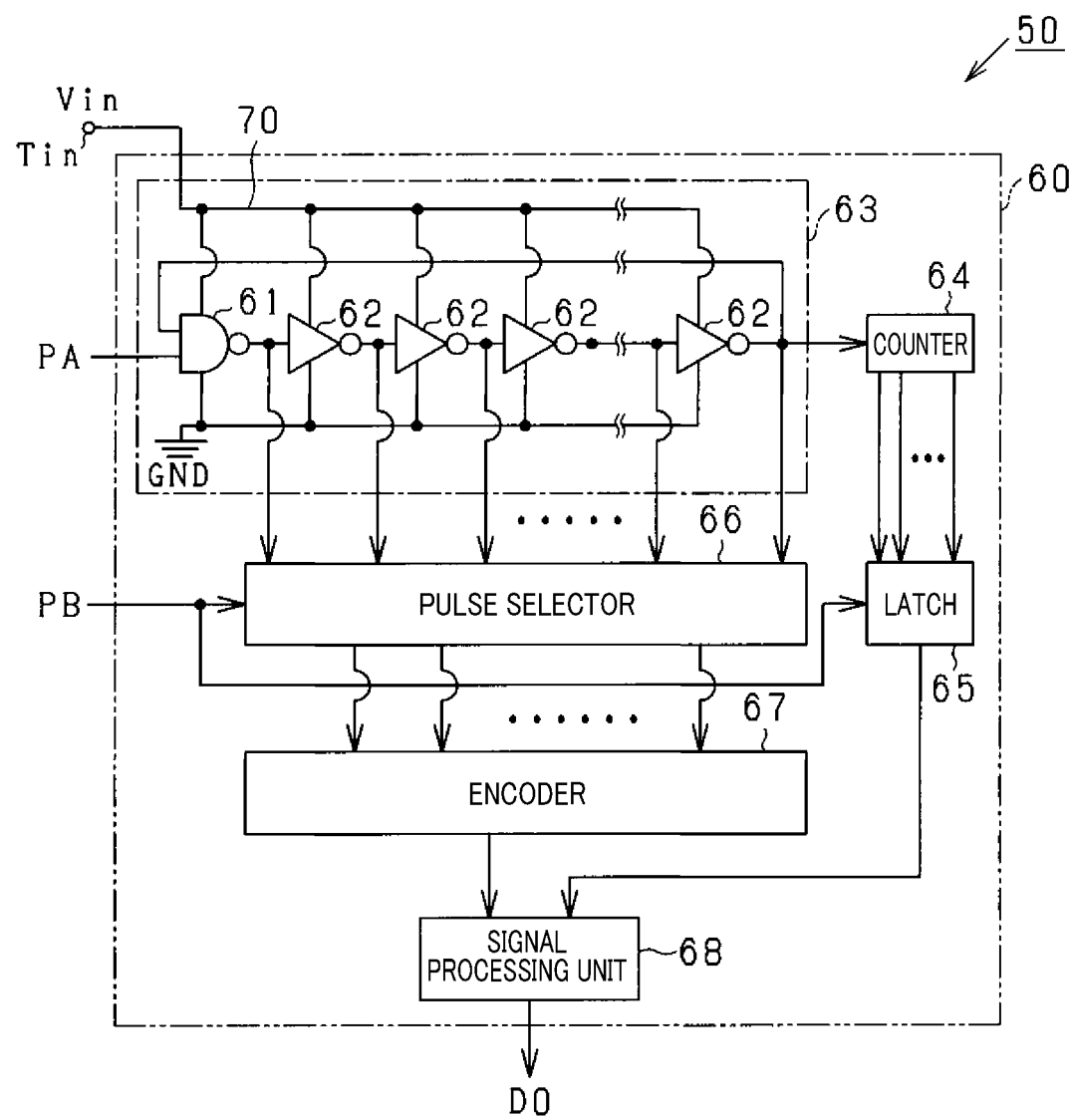
FIG. 12 is a block diagram schematically illustrating in detail a shunt current detection unit illustrated in FIG. 11.

The following describes a motor system 100A according to the second embodiment of the present disclosure with reference to FIGS. 11 and 12. The structures and/or functions of the motor system 100A according to the second embodiment are different from those of the motor system 100 according to the first embodiment mainly by the following points. So, the following mainly describes the different points, and omits or simplifies descriptions of like parts between the first and second embodiments, to which identical or like reference characters are assigned, thus eliminating redundant descriptions.

The motor system 100A includes a control apparatus 30A, and the control apparatus 30A includes a current detection apparatus 1A, which differs from the current detection apparatus 1.

Specifically, the current detection apparatus 1A includes a shunt current detection unit 50 and an arm current detection unit 51, which differ from the respective shunt current detection unit 44 and arm current detection unit 41.

Referring to FIG. 12, the shunt current detection unit 50 includes an encoding circuit 60 that encodes a phase difference between first and second pulse signals PA and PB.

The encoding circuit 60 for example includes a single NAND circuit 61 and an even number of NOT circuits 62. The NAND circuit 61 and the NOT circuits 62 according to the second embodiment serve as, for example, an inverting circuit. The NAND circuit 61 serves as a starting inverting circuit having an input terminal to which the first pulse signal PA is input. The NAND circuit 61 and the NOT circuits 62 are coupled in a ring form to form a pulse running circuit 63.

The encoding circuit 60, i.e. pulse propagating circuit, includes a counter 64 and a latch circuit 65. The counter 64 counts the number of circulations of a pulse signal in the pulse running circuit 63 on the basis of the number of inversions of the logical value of the output signal of the NOT circuit 62 provided upstream of the NAND circuit 61, thus generating binary digital data based on the counted value. The latch circuit 65 latches the digital data output from the counter 64.

The encoding circuit 60 includes a pulse selector 66 and an encoder 67; these units 66 and 67 serve as, for example, a running position detection unit.

The pulse selector 66 captures the output signals of the respective NAND circuit 61 and NOT circuits 62, which constitute the pulse running circuit 63. Then, the pulse selector 66 extracts a pulse signal circulating in the pulse running circuit 63 from the logical values of the captured output signals, thus generating a signal representing the position of the pulse signal. The encoder 67 generates digital data corresponding to the output signal of the pulse selector 66.

The encoding circuit 60 includes a signal processing unit 68. The signal processing unit 68 captures the digital data output from the latch circuit 65 as higher-order bits, and the digital data output from the encoder 67 as lower-order bits, and subtracts the data of the higher-order bits from the data of the lower-order bits. Consequently, the signal processing unit 68 generates binary digital data DO representing the phase difference between the first and second pulse signals PA and PB. The digital data DO generated by the signal processing unit 68 is input to the current selection unit 47. The latch circuit 65 and the pulse selector 66 operate in response to the second pulse signal PB.

The pulse running circuit 63 starts the circulation operation of a pulse signal when the logical value of the first pulse signal PA is changed to a high level H. The pulse signal is circulated over the period during which the first pulse signal PA is the high level H. The counter 64 counts the number of circulations of the pulse signal. The latch circuit 65 latches the counted result at a timing when the logical value of the second pulse signal PB is changed to the high level H.

When the logical value of the second pulse signal PB is turned to the high level H, the pulse selector 66 detects the circulation position of the pulse signal in the pulse running circuit 63. The encoder 67 then generates digital data corresponding to the circulation position. As a result, the signal processing unit 68 generates and outputs the binary digital data DO corresponding to a time Tc from the rising edge of the first pulse signal PA to the rising edge of the second pulse signal PB on the basis of the digital data from the encoder 67 and the digital data latched by the latch circuit 65.

A common power supply line 70, which supplies power to the NAND circuit 61 and the NOT circuits 62, is connected to a signal input terminal Tin to which an analog voltage signal Vin in accordance with the voltage drop across the shunt resistor 23 is applied. Specifically, the voltage signal Vin is applied as a power supply voltage for the circuits 61 and 62.

The inversion operation time of each of the circuits 61 and 62 depends on the power supply voltage. The digital data DO output from the signal processing unit 68 therefore changes depending on the voltage level of the voltage signal Vin. When the time Tc is set to be constant, digital data corresponding to the voltage signal Vin is obtained.

In the second embodiment, the shunt timing generation unit 45 illustrated in FIG. 11 outputs the first pulse signal PA and the second pulse signal PB such that the time Tc from the rising edge of the first pulse signal PA to the rising edge of the second pulse signal PB is kept constant. The timing when the shunt timing generation unit 45 outputs the first pulse signal PA is set based on the timing when it is determined that the voltage vector is switched to one of the active voltage vectors V1 to V6.

Specifically, the timing to output the first pulse signal PA can be set to, for example, a timing when the specified time Tsta passes after the timing when it is determined that the voltage vector is switched to one of the active voltage vectors V1 to V6. Moreover, the timing to output the first pulse signal PA can be set to, for example, a timing immediately after the timing when it is determined that the voltage vector is switched to one of the active voltage vectors V1 to V6. With this configuration illustrated in FIG. 12, the setting is based on that the constraint of the period during which ringing occurs is not imposed since the voltage signals Vin are averaged by integration.

The arm current detection unit 51 also includes the encoding circuit 60 included in the shunt current detection unit 50. The arm current detection unit 51 captures the voltages between the sources and the drains of the lower-arm switches as the voltage signals Vin in a same manner as that of the shunt current detection unit 50, thus detecting three phase currents. The timing for the arm timing generation unit 42 to output the first pulse signal PA is set on the basis of the timing when it is determined that the voltage vector is switched to the zero voltage vector V0. Specifically, the timing to output the first pulse signal PA can be set to, for example, the timing when the specified time Tsta passes after the timing when it is determined that the voltage vector is switched to the zero voltage vector V0. Moreover, the timing to output the first pulse signal PA can be set to, for example, the timing immediately after the timing when it is determined that that the voltage vector is switched to the zero voltage vector V0.

The motor control system 100A according to the embodiment described above enables a minute change of the voltage signal Vin to be converted into a numeric value, thus detecting the phase currents without using an analog amplifier that amplifies the voltage signal Vin.

OTHER EMBODIMENTS

The above embodiments can be modified as described below.

The method for correcting the correction gains Gu, Gv, and Gw on the basis of the detected temperature Ts is not limited to the one illustrated in the first embodiment. A modified method described hereinafter can be used as the method for correcting the correction gains Gu, Gv, and Gw on the basis of the detected temperature Ts.

If the detected temperature Ts is equal to the reference temperature Tref, the modified method sets a temperature correction amount to zero. On the other hand, the modified method sets the temperature correction amount to be smaller as the detected temperature Ts increases with reference to the reference temperature Tref. The modified method sets the temperature correction amount to be larger as the detected temperature Ts decreases with reference to the reference temperature Tref. The modified method adds the temperature correction amount to the correction gains Gu, Gv, Gw, thus correcting the correction gains Gu, Gv, Gw.

Each embodiment can eliminate the correction for the correction gains Gu, Gv, Gw based on the detected temperature Ts by the temperature correction unit 48b.

The first embodiment is configured such that the peak values of the phase currents of the arm current detection unit 41 and the shunt current detection unit 44, which are used to calculate correction gains, have the same sign, but the present disclosure is not limited to the configuration. Specifically, the peak values of the phase currents of the arm current detection unit 41 and the shunt current detection unit 44 can have different signs. For example, a positive peak value of a phase current detected by the arm current detection unit 41 can be divided by a negative peak value of a corresponding phase current detected by the shunt current detection unit 44 to calculate a correction gain. The positive and negative peak values of phase currents appear alternately at every 60 electrical degrees. Hence, the peak values of the U-, V-, and W-phase currents Isu, Isv, and Isw sequentially detected by the shunt current detection unit 44 within the range of 120 electrical degrees can be used to calculate correction gains.

The first embodiment is configured to use the peak values of phase currents to calculate the correction gains, but the present disclosure is not limited thereto. Specifically, values of phase currents other than their peaks can be used for calculating the correction gains.

For example, a modified correction gain calculation unit 48a is configured to obtain a first leading value of the phase current, which leads by a predetermined electrical degree from a peak value of a phase current detected by the arm current detection unit 41. Similarly, the modified correction gain calculation unit 48a is configured to obtain a second leading value of the corresponding phase current, which leads by the predetermined electrical degree from a peak value of a phase current detected by the shunt current detection unit 44.

Then, the modified correction gain calculation unit 48a is configured to divide the first leading value by the second leading value, thus calculating a correction gain. The predetermined electrical degree is set to, for example, an angle less than 90 electrical degrees.

Specifically, the modified correction gain calculation unit 48a can obtain the first leading value of a phase current detected by the arm current detection unit 41 at a timing when a predetermined time has elapsed since the detection timing of the peak value as long as the rotational speed of the motor 10 is constant. Similarly, the modified correction gain calculation unit 48a can obtain the second leading value of a phase current detected by the shunt current detection unit 44 at a timing when a predetermined time has elapsed since the detection timing of the peak value as long as the rotational speed of the motor 10 is constant.

If a rotational angle sensor is provided in the control apparatus 30, the modified correction gain calculation unit 48a can obtain the first leading value of a phase current detected by the arm current detection unit 41 at a timing based on rotational angle information measured by the rotational angle sensor. Similarly, the modified correction gain calculation unit 48a can obtain the second leading value of a phase current detected by the shunt current detection unit 44 at a timing based on rotational angle information measured by the rotational angle sensor.

The arm current detection unit 41 can detect each of two phase currents on the basis of the voltage between the source and drain of a corresponding one of the lower-arm switches for the corresponding two phases in a period during which the voltage vector is one of the odd-numbered voltage vectors V1, V3, and V5. This enables the remaining phase current to be calculated based on the following relationship:

$$Iu+Iv+Iw=0$$

FIG. 4(b) illustrates that each of the V- and W-phase currents can be detected on the basis of the voltage between the source and drain of a corresponding one of the V- and W-phase lower-arm switches Svn and Swn in the period during which the voltage vector is the odd-numbered voltage vector V1.

Two-phase lower-arm switches in the three-phase lower-arm switches can be used as detection switches for detecting corresponding phase currents.

Figures 13, 14:
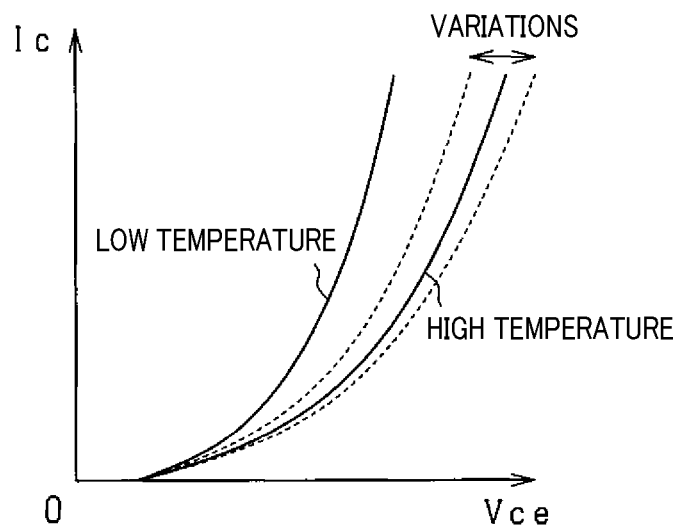
FIG. 13 is a table schematically illustrating the relationships among (I) voltage vectors of an output voltage of an inverter, (II) phase currents detectable based on a bus current, and (III) phase currents detectable based on arm currents according to a first modification of each embodiment.
FIG. 14 is a graph schematically illustrating variations in collector-emitter voltage drops across insulated-gate bipolar transistors (IGBTs) due to their individual differences and their temperatures according to a second modification of each embodiment.

Each of the first and second embodiments can be modified as a first modification to detect each phase current based on the voltage between the source and drain of the corresponding upper-arm switch instead of the lower-arm switches. The relationships between each of detectable phase currents and a corresponding one of voltage vectors according to the first modification are illustrated in FIG. 13. In FIG. 13, the sign of the voltage between the source and drain of each upper-arm switch while the drain potential is higher than the source potential is defined as positive. Moreover, in FIG. 13, the direction in which an actual phase current flows from the side of the inverter 20 to the side of the motor 10 is defined as the positive direction as described above.

If the modulation rate Mr is located in the high modulation region illustrated in FIG. 5, the signal generator 39 can generate drive signals gup, gun, gvp, gvn, gwp, and gwn using known two-phase modulation.

The two-phase modulation is configured to change the command duties Dutyu, Dutyv, and Dutyw such that (1) The operating states of the upper- and lower-arm switches of a successively selected one of the three phases are fixed for every predetermined period (2) Pulse width modulation based on comparison between each of the command duties Dutyu, Dutyv, and Dutyw and the carrier signal SigC controls on-off switching operations of the lower-arm switches of the remaining two-phases, thus generating the drive signals gup, gun, gvp, gvn, gwp, and gwn.

For example, the two-phase modulation is configured to change the command duties Dutyu, Dutyv, and Dutyw for every 120 electrical degrees such that (1) The upper-arm switch of a successively selected one of the three phases is fixed to off (2) The lower-arm switch of the successively selected one of the three-phases is fixed to on.

This increases the time of an odd-numbered voltage vector, thus enabling the arm current detection unit 41 to detect two phase currents even if the modulation factor Mr is located in the high modulation region.

The method for calculating the command duties is not limited to the one illustrated in FIG. 1 of the first embodiment. For example, a method, which is disclosed in FIG. 4 of the document whose title is "Sensorless Controls of Salient-Pole Permanent Magnet Synchronous Motors Using Extended Electromotive Force Models", T.IEE Japan, Vol. 122-D, No. 12, 2002, can be used to calculate the command duties.

Specifically, the method disclosed in the above document calculates the command values of $\gamma$- and $\delta$-axis currents in a $\gamma$-$\delta$ estimation rotating coordinate system defined in the motor 10 as manipulated variables; the manipulated variables are used for feedback control of an actual rotational speed Nr of the motor 10 to the commanded rotational speed Ntgt.

Next, the method disclosed in the above document calculates $\gamma$- and $\delta$-axis commanded voltages on the basis of the calculated command values of the $\gamma$- and $\delta$-axis currents, the current $\gamma$- and $\delta$-axis currents, and the actual rotational speed Nr. Then, the method disclosed in the above document converts the $\gamma$- and $\delta$-axis commanded voltages into three-phase commanded duties using an electrical angle $\theta$ of the motor 10. For example, the method disclosed in the above document can estimate the electrical angle $\theta$ of the motor 10 using an extended electromotive force observer. Moreover, the method disclosed in the above document can calculate the actual rotational speed Nr on the basis of the electrical angle $\theta$ estimated by the extended electromotive force observer.

Each switch constituting the inverter 20 is not limited to a MOSFET, but can be comprised of, for example, an insulated-gate bipolar transistor (IGBT). If each switch is comprised of an IGBT, each switch includes a flywheel diode or flyback diode connected in anti-parallel to the IGBT. FIG. 14 schematically illustrates variations in drops of collector-emitter voltages Vce across IGBTs due to their individual differences and their temperatures while a predetermined collector current Ice is flowing through the IGBTs according to a second modification of each embodiment.

Moreover, each switch constituting the inverter 20 is not limited to a voltage-controlled switching element, but can be comprised of, for example, a current-controlled switching element, such as a bipolar transistor.

The NAND circuit 61 and the NOT circuits 62 according to the second embodiment can be connected in series.

The shunt resistor 23 can be provided on the positive bus Lp instead of the negative bus Ln. Specifically, the shunt resistor 14 can be located on the positive bus Lp to be closer to the positive terminal of the battery 21 than the connection points to the respective upper-arm switches Sup, Svp, and Swp are.

A bus current detection unit according to the present disclosure can be configured not to use a shunt resistor, and can be designed to measure a bus current itself or a parameter indicative of the bus current.

The controlled variable of the motor 10 is not limited to the rotational speed. Torque or another parameter can be used as the controlled variable of the motor 10.

The motor 10 can be configured such that the second ends of the U-, V-, and W-phase windings are connected in delta-configuration (Δ-configuration). Moreover, the motor 10 is not limited to three phase motors, but can be designed as multiphase motors other than three-phase motors. Furthermore, the motor 10 is not limited to the one used to drive vehicle-mounted auxiliary devices, but can be used vehicle-mounted main engines serving as a power source for generating running power of a vehicle. In addition, the motor 10 is not limited to a permanent magnet synchronous motor, but can be designed as, for example, a wound-field synchronous motor or synchronous reluctance motor. In addition, the motor 10 is not limited to a synchronous motor, but can be designed as another rotary electric machine, such as an induction rotary electric machine.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A current detection apparatus for application to a system including a direct-current power supply, an inverter including plural pairs of series-connected upper-arm switches and lower-arm switches, and a three-phase rotary electric machine connected to the inverter, the upper- and lower-arm switches of each pair being connected to a corresponding one phase of the three-phase rotary electric machine, an upper set of the upper-arm switches being connected to the direct-current power supply via a first bus, a lower set of the lower-arm switches being connected to the direct-current power supply via a second bus, first to third phase switches selected in one of the upper set of the upper-arm switches and the lower set of the lower-arm switches being respectively defined as first to third detection switches, the first to third phase switches corresponding to respective first to third phases of the three-phase rotary electric machine, the current detection apparatus comprising:

an arm current detection unit configured to detect each of first to third phase currents having respective amplitudes and flowing in the three-phase rotary electric machine based on a potential difference between input and output terminals of the corresponding one of the first to third detection switches while the corresponding one of the first to third detection switches is on, the first to third detection switches being lower-arm switches in the lower set of the lower-arm switches, the first to third detection switches being commonly connected to a common signal ground of the current detection apparatus;

a bus current detection unit configured to detect each of at least bus-based first to third phase currents corresponding to the first to third phases of the three-phase rotary electric machine based on a current flowing through one of the first and second buses; and an amplitude correction unit configured to correct all of the first to third phase currents detected by the arm current detection unit based on the bus-based first to third phase currents detected by the bus current detection unit such that the amplitudes of all of the respective first to third phase currents detected by the arm current detection unit match with each other, wherein the amplitude correction unit is configured to multiply all of the first to third phase currents detected by the arm current detection unit by a correction gain for all corresponding first to third phase currents, thus correcting all the first to third phase currents detected by the arm current detection unit, to reduce variations between the amplitudes.

2. The current detection apparatus according to claim 1, wherein:

the bus current detection unit includes a portion for measuring the current flowing through one of the first and second buses; and the amplitude correction unit is configured to correct the first to third phase currents detected by the arm current detection unit based on a temperature of the portion of the bus current detection unit in addition to the bus-based first to third phase currents detected by the bus current detection unit.

3. The current detection apparatus according to claim 2, further comprising:

a temperature measuring unit configured to measure the temperature of the portion of the bus current detection unit, and a gain calculation unit comprising:

a temperature correction unit configured to correct the correction gain for each of the first to third phase currents to thereby decrease the correction gain for each of the first to third phase currents as the measured temperature of the portion of the bus current detection unit increases.

4. The current detection apparatus according to claim 1, wherein:

the bus current detection unit is configured to sequentially detect peak values of the respective bus-based first to third phase currents; and the amplitude correction unit is configured to correct the first to third phase currents detected by the arm current detection unit based on:

the peak values of the bus-based first to third phase currents detected by the bus current detection unit; and peak values of the first to third phase currents detected by the arm current detection unit.

5. The current detection apparatus according to claim 4, further comprising:

a gain calculation unit configured to divide the peak value of each of the bus-based first to third phase currents detected by the bus current detection unit by the peak value of the corresponding one of the first to third phase currents detected by the arm current detection unit, thus calculating the correction gain for each of the first to third phase currents detected by the arm current detection unit.

6. The current detection apparatus according to claim 5, further comprising:

a storage unit configured to store the correction gains for the respective first to third phase currents calculated by the gain calculation unit, wherein the amplitude correction unit is configured to correct the first to third phase currents based on the correction gains for the respective first to third phase currents stored in the storage unit during a start of the three-phase rotary electric machine.

7. The current detection apparatus according to claim 1, wherein the first to third detection switches are lower-arm switches selected in the lower set of the lower-arm switches.

8. The current detection apparatus according to claim 1, wherein the arm current detection unit is configured to detect the at least first to third phase currents based on the potential differences between the input and output terminals of the respective first to third detection switches while the first to third detection switches are simultaneously on.

9. The current detection apparatus according to claim 1, wherein each of the arm current detection unit and bus current detection unit comprises:
  a pulse running circuit comprising:
    a plurality of inverting circuits connected in series, each of the inverting circuits being configured to perform an inverting operation of inverting a logical value of an input signal to output an inverted signal, and to have a time of the inversion operation changing on a power supply voltage, the inverting circuits including a start inverting circuit configured such that the inverting operation thereof is externally controllable, the inverting circuits being configured to run a pulse signal in response to activation of the start inverting circuit;
  a signal input terminal connected to a common power supply line of the inverting circuits and configured such that an analog voltage signal based on a corresponding one of the first phase current, the second phase current, the third phase current, the bus-based first phase current, the bus-based second phase current, the bus-based third phase current is input thereto as a power supply voltage of each of the inverting circuits;
  a running position detection unit configured to detect a running position of the pulse signal in the pulse running circuit based on an output signal of each of the inverting circuits, thus generating digital data corresponding to the detected running position of the pulse signal; and
  a signal processing unit configured to capture the digital data generated by the running position detection unit, and generate, based on the captured digital data, binary digital data,
  the running position detection unit being configured to detect the running position of the pulse signal in the pulse running circuit at a timing when a predetermined time passes after start of running of the pulse signal by the pulse running circuit.

10. A control apparatus for controlling a controlled variable of a three-phase rotary electric machine of a system including a direct-current power supply, and an inverter including plural pairs of series-connected upper-arm switches and lower-arm switches and connected to the multi-phase rotary electric machine, the upper- and lower-arm switches of each pair being corrected to a corresponding one phase of the multi-phase rotary electric machine, an upper set of the upper-arm switches being connected to the direct-current power supply via a first bus, a lower set of the lower-arm switches being connected to the direct-current power supply via a second bus, first to third phase switches selected in one of the upper set of the upper-arm switches and the lower set of the lower-arm switches being respectively defined as first to third detection switches, the first to third phase switches corresponding to respective first to third phases of the multi-phase rotary electric machine, the control apparatus comprising:
  the current detection apparatus according to claim 1; and
  a current selection unit configured to use a modulation rate of an output voltage of the inverter to select, as controlling phase currents for controlling the controlled variable of the three-phase rotary electric machine, one of:
    the at least first to third phase currents detected by the arm current detection unit; and
    the at least bus-based first to third phase currents detected by the bus current detection unit,
  wherein the amplitude correction unit is configured to correct the first to third phase currents detected by the arm current detection unit when the current selection unit selects, as the controlling phase currents for controlling the controlled variable of the three-phase rotary electric machine, the at least first to third phase currents detected by the arm current detection unit.

11. The control apparatus according to claim 10, wherein:
  the current selection unit is configured to:
    select, as the controlling phase currents for controlling the controlled variable of the three-phase rotary electric machine, the at least first to third phase currents detected by the arm current detection unit when the modulation rate is in a low modulation region lower than a high modulation region; and
    select, as the controlling phase currents for controlling the controlled variable of the three-phase rotary electric machine, the at least bus-based first to third phase currents detected by the bus current detection unit when the modulation rate is in the high modulation region.

12. The control apparatus according to claim 11, wherein, when the modulation rate is in a middle modulation region higher than the low modulation region and lower than the high modulation region, the current selection unit is configured to:
  use, as one of the controlling phase currents for controlling the controlled variable of the three-phase rotary electric machine, an average value of the first phase current detected by the arm current detection unit and the bus-based first phase current detected by the bus current detection unit; and
  use, as the other of the controlling phase currents for controlling the controlled variable of the three-phase rotary electric machine, an average value of the second phase current detected by the arm current detection unit and the bus-based second phase current detected by the bus current detection unit.

* * * * *